(12) United States Patent
Sakakibara (10) Patent No.: US 10,566,295 B2
(45) Date of Patent: Feb. 18, 2020

(54) SEMICONDUCTOR DEVICE

(71) Applicant: Toyota Jidosha Kabushiki Kaisha, Toyota-shi, Aichi-ken (JP)

(72) Inventor: Akinori Sakakibara, Toyota (JP)

(73) Assignee: Toyota Jidosha Kabushiki Kaisha, Toyota-shi, Aichi-ken (JP)

(*) Notice: Subject to any disclaimer, the term of this patent is extended or adjusted under 35 U.S.C. 154(b) by 0 days.

(21) Appl. No.: 16/201,307

(22) Filed: Nov. 27, 2018

(65) Prior Publication Data
US 2019/0164913 A1 May 30, 2019

(30) Foreign Application Priority Data
Nov. 29, 2017 (JP) .................................. 2017-228992

(51) Int. Cl.
*H01L 23/057* (2006.01)
*H01L 23/00* (2006.01)
(Continued)

(52) U.S. Cl.
CPC .......... *H01L 23/562* (2013.01); *H01L 23/057* (2013.01); *H01L 23/3735* (2013.01); *H01L 23/49531* (2013.01); *H01L 23/49562* (2013.01); *H01L 24/32* (2013.01); *H01L 23/49548* (2013.01); *H01L 24/13* (2013.01); *H01L 24/29* (2013.01); *H01L 24/33* (2013.01); *H01L 24/73* (2013.01); *H01L 2224/13101* (2013.01); *H01L 2224/16225* (2013.01); *H01L 2224/29101* (2013.01); *H01L 2224/32155* (2013.01); *H01L 2224/32225* (2013.01);
(Continued)

(58) Field of Classification Search
CPC . H01L 23/562; H01L 23/057; H01L 23/3735; H01L 23/49531; H01L 23/49562; H01L 24/32
See application file for complete search history.

(56) References Cited

U.S. PATENT DOCUMENTS

2011/0037166 A1  2/2011 Ikeda et al.
2015/0071509 A1*  3/2015 Myers .................. G06K 9/0002
                                                              382/124
(Continued)

FOREIGN PATENT DOCUMENTS

JP   2004-134703 A   4/2004
JP   2014-060410 A   4/2014
(Continued)

*Primary Examiner* — Nathan W Ha
(74) *Attorney, Agent, or Firm* — Dinsmore & Shohl LLP (57) ABSTRACT

A semiconductor device includes a semiconductor element, an insulated substrate on which the semiconductor element is located, and an external connection terminal electrically connected to the semiconductor element via the insulated substrate. The insulated substrate includes an insulator layer, an inner conductor layer located on one side of the insulator layer and electrically connected to the semiconductor device, and an outer conductor layer located on the other side of the insulator layer. The external connection terminal includes, along a longitudinal direction of the external connection terminal, a thin section and a thick section that is thicker than the thin section, and the external connection terminal is joined to the inner conductor layer of the insulated substrate at the thin section.

12 Claims, 5 Drawing Sheets

(51) Int. Cl.
*H01L 23/373* (2006.01)
*H01L 23/495* (2006.01)

(52) U.S. Cl.
CPC ............. *H01L 2224/33181* (2013.01); *H01L 2224/73203* (2013.01); *H01L 2224/73253* (2013.01); *H01L 2924/1033* (2013.01); *H01L 2924/10253* (2013.01); *H01L 2924/10272* (2013.01); *H01L 2924/13055* (2013.01); *H01L 2924/13091* (2013.01); *H01L 2924/14252* (2013.01); *H01L 2924/181* (2013.01); *H01L 2924/351* (2013.01)

(56) References Cited

U.S. PATENT DOCUMENTS

| | | | | |
|---|---|---|---|---|
| 2016/0233202 A1* | 8/2016 | Komo | ............... | H01L 23/00 |
| 2016/0247736 A1* | 8/2016 | Kuwahara | ............... | H01L 23/26 |
| 2017/0352629 A1* | 12/2017 | Fukumoto | ............... | H01L 24/37 |
| 2018/0096937 A1* | 4/2018 | Saegusa | ............... | H01L 23/3735 |
| 2019/0080972 A1* | 3/2019 | Sato | ............... | H01L 23/24 |

FOREIGN PATENT DOCUMENTS

| | | |
|---|---|---|
| WO | 2012/096066 A1 | 7/2012 |
| WO | 2013/005474 A1 | 1/2013 |

\* cited by examiner

SEMICONDUCTOR DEVICE

CROSS-REFERENCE TO RELATED APPLICATIONS

This application claims priority to Japanese Patent Application No. 2017-228992, filed on Nov. 29, 2017, the entire contents of which are incorporated herein by reference.

TECHNICAL FIELD

The technique disclosed herein relates to a semiconductor device.

BACKGROUND

A semiconductor device is described in International Publication No. WO2013/005474. The semiconductor device includes a semiconductor element, an insulated substrate on which the semiconductor element is disposed, and external connection terminals electrically connected to the semiconductor element via the insulated substrate. The insulated substrate includes an insulator layer, an inner conductor layer located on one side of the insulator layer and electrically connected to the semiconductor element, and an outer conductor layer located on the other side of the insulator layer. One end of the external connection terminal is joined to the inner conductor layer of the insulated substrate.

SUMMARY

When a temperature of the semiconductor device increases, the inner conductor layer of the insulated substrate and the external connection terminal respectively expand thermally. During this time, the thermal expansion of the inner conductor layer in the insulated substrate is suppressed by the adjacent insulator layer, and thus becomes smaller than the thermal expansion of the external connection terminal. Consequently, a relatively high stress is likely to occur in a joint portion between the inner conductor layer and the external connection terminal due to a difference in the thermal expansion therebetween, which may reduce durability of the semiconductor device. The technique described herein can at least partly solve such problems.

A semiconductor device may comprise a semiconductor element, an insulated substrate on which the semiconductor element is located, and an external connection terminal electrically connected to the semiconductor element via the insulated substrate. The insulated substrate may comprise an insulator layer, an inner conductor layer located on one side of the insulator layer and electrically connected to the semiconductor device, and an outer conductor layer located on the other side of the insulator layer. The external connection terminal may comprise, along a longitudinal direction of the external connection terminal, a thin section and a thick section that is thicker than the thin section, and the external connection terminal may be joined to the inner conductor layer of the insulated substrate at the thin section.

In the semiconductor device described above, the external connection terminal includes a thin section with a small thickness and is joined to an inner conductor layer of the insulated substrate at the thin section. Since thermal stress that would be generated in the external connection terminal is suppressed in the thin section with the small thickness, a stress that occurs in the joint portion between the external connection terminal and the inner conductor layer is reduced. Meanwhile, the external connection terminal also includes a thick section with a large thickness, so that in this thick section, the external connection terminal can maintain a strength required for connection with an external component.

DETAILED DESCRIPTION

In an embodiment of the present technique, at least a part of a thick section of an external connection terminal and at least a part of an inner conductor layer of an insulated substrate may be located in a common plane that is parallel to the insulated substrate. With this configuration, the thickness of the thick section can be increased while reducing an entire thickness of the semiconductor device. Here, the term thickness of the semiconductor device means a size of the semiconductor device in a direction perpendicular to the insulated substrate.

In an embodiment of the present technique, a part of a thick section of the external connection terminal and at least a part of an insulator layer of the insulated substrate may be located in a common plane that is parallel to the insulated substrate. With this configuration, the thickness of the semiconductor device can be further reduced.

In an embodiment of the present technique, a thickness of the thin section of the external connection terminal may be smaller than a thickness of the inner conductor layer of the insulated substrate. As mentioned above, the thermal expansion of the inner conductor layer is restricted by the adjacent insulator layer. Through this, when the thickness of the thin section of the external connection terminal is smaller than the thickness of the inner conductor layer, stress that occurs in the joint portion between the external connection terminal and the inner conductor layer is effectively reduced.

In an embodiment of the present technique, the semiconductor device may further include an encapsulant encapsulating the semiconductor element. In this case, the thin section of the external connection terminal may be located within the encapsulant, and the thick section of the external connection terminal may extend from the thin section to outside the encapsulant. With this configuration, the semiconductor element can be protected by the encapsulant.

In the above-mentioned embodiment, the outer conductor layer of the insulated substrate may be exposed on a surface of the encapsulant. With this configuration, heat generated in the semiconductor element is effectively dissipated into the outside via the insulated substrate. That is, the insulated substrate can also function as a heat sink.

In the above-mentioned embodiment, the semiconductor device may further include a second insulated substrate opposed to the insulated substrate with the semiconductor element interposed. In this case, the second insulated substrate may include a second insulator layer, a second inner conductor layer located on one side of the second insulator layer and electrically connected to the semiconductor element, and a second outer conductor layer located on the other side of the second insulator layer. In addition, the second outer conductor layer of the second insulated substrate may be exposed on a surface of the encapsulant. With this configuration, heat generated in the semiconductor element is further dissipated effectively into the outside via the second insulated substrate. That is, the semiconductor element can be cooled from its both surfaces by both the first insulated substrate and the second insulated substrate.

In the above-mentioned embodiment, the semiconductor device may further include a second external connection terminal electrically connected to the semiconductor element via the second insulated substrate. In this case, the second external connection terminal may include, along a longitudinal direction of the second external connection terminal, a thin section and a thick section that is thicker than the thin section, and the second external connection terminal may be joined to the second inner conductor layer of the second insulated substrate at the thin section. With this configuration, like the above-mentioned external connection terminal, stress that occurs in the joint portion between the second external connection terminal and the second inner conductor layer can be reduced. Furthermore, the second external connection terminal can also maintain the strength required for connection with an external component.

In the above-mentioned embodiment, at least a part of the thick section of the second external connection terminal and at least a part of the second inner conductor layer of the second insulated substrate may be located in a common plane that is parallel to the second insulated substrate. With this configuration, the thickness of the thick section can be increased while the entire thickness of the semiconductor device can be reduced.

In the above-mentioned embodiment, a part of the thick section of the second external connection terminal and at least a part of the second insulator layer of the second insulated substrate may be located in a common plane that is parallel to the second insulated substrate. With this configuration, the thickness of the semiconductor device can be further reduced.

In the above-mentioned embodiment, a thickness of the thin section of the second external connection terminal may be smaller than a thickness of the second inner conductor layer of the second insulated substrate. Thermal expansion of the second inner conductor layer is restricted by the adjacent second insulator layer. Through this, when the thickness of the thin section of the second external connection terminal is smaller than the thickness of the second inner conductor layer, stress that occurs in the joint portion between the second external connection terminal and the second inner conductor layer is effectively reduced.

In the above-mentioned embodiment, the thin section of the second external connection terminal may be located within the encapsulant, and the thick section of the second external connection terminal may extend from the thin section to outside the encapsulant.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiments

A semiconductor device 10 of an embodiment will be described below with reference to attached drawings. The semiconductor device 10 can be used, for example, in power conversion circuits, such as a converter and an inverter in electric vehicles. The term "electric vehicle" as used herein broadly means vehicles having motors for driving wheels. Examples of the electric vehicle include an electric vehicle charged with external electric power, a hybrid vehicle having an engine in addition to the motor, a fuel cell vehicle using a fuel cell as a power source, and the like.

Figure 1:
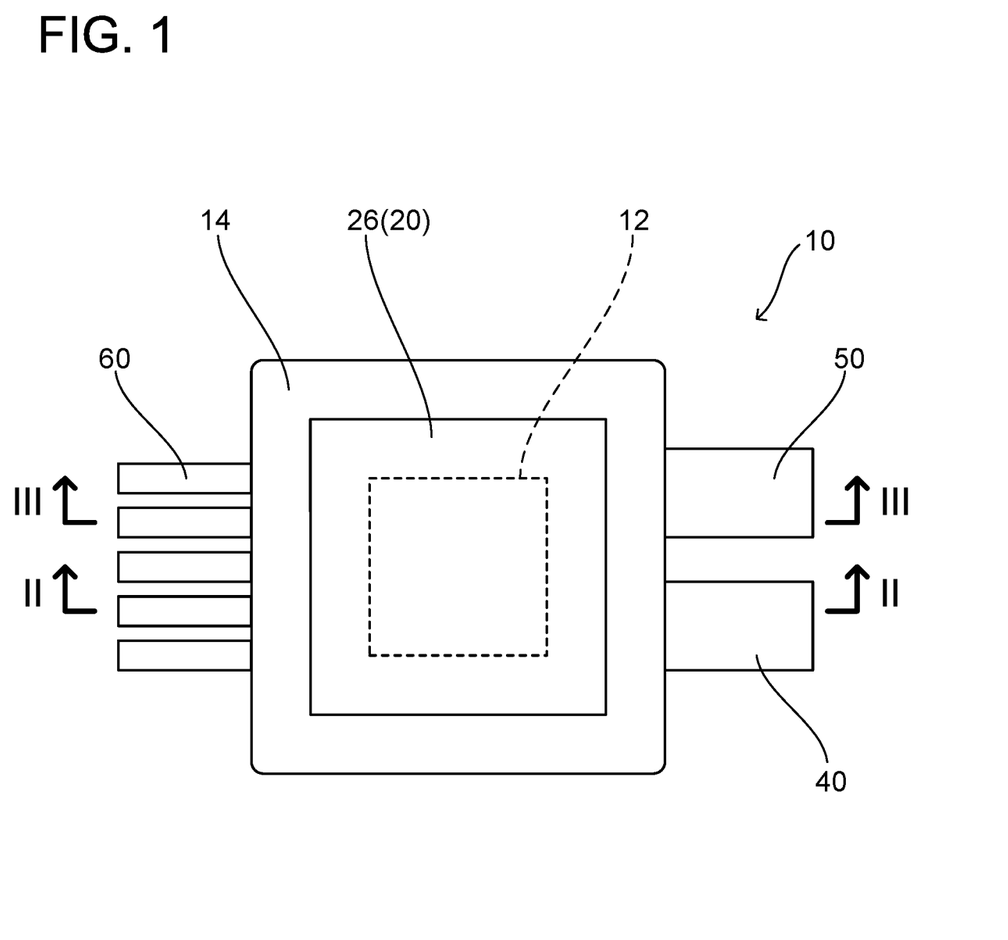
FIG. 1 shows a plan view of a semiconductor device 10 according to a first embodiment.
Figure 2:
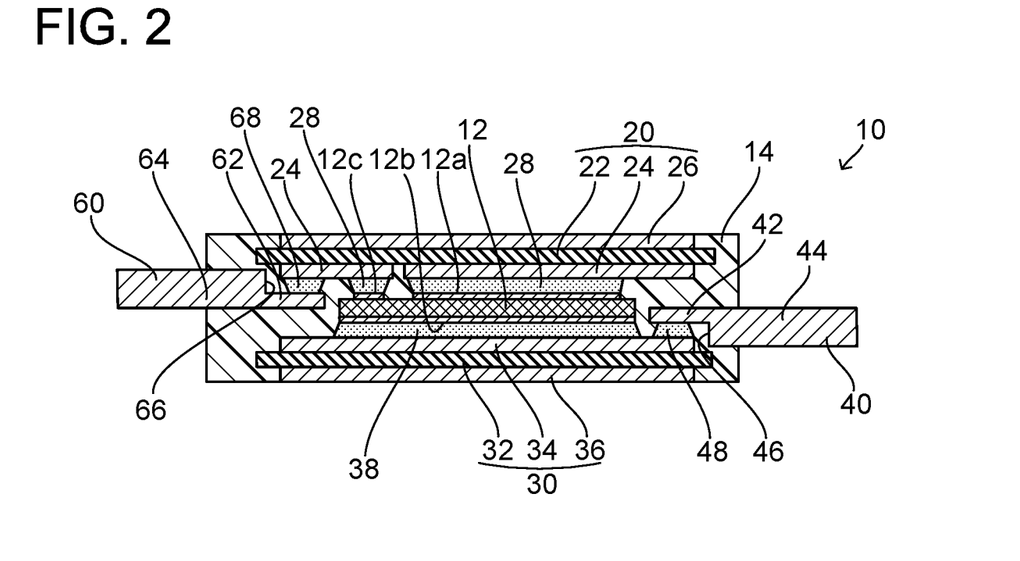
FIG. 2 shows a cross-sectional view along a line II-II in FIG. 1.
Figure 3:
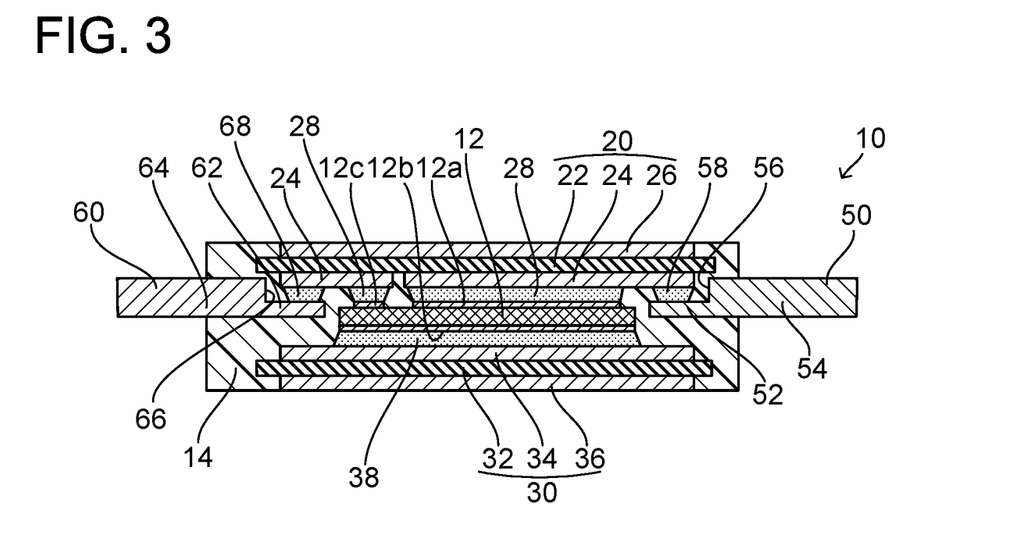
FIG. 3 shows a cross-sectional view along a line III-III in FIG. 1.

As shown in FIGS. 1 to 3, the semiconductor device 10 includes a semiconductor element 12 and an encapsulant 14 encapsulating the semiconductor element 12. The semiconductor element 12 is a so-called power semiconductor element for a power circuit. Specific types and structures of the semiconductor element 12 are not particularly limited. For example, a Metal-Oxide-Semiconductor Field-Effect Transistor (MOSFET) element, an Insulated Gate Bipolar Transistor (IGBT) element, and the like can be used as the semiconductor element 12. The semiconductor material used for the semiconductor element 12 is not also particularly limited, and may be, for example, silicon (Si), silicon carbide (SiC), or a nitride semiconductor, such as or gallium nitride (GaN). The semiconductor element 12 includes an upper electrode 12a, a lower electrode 12b, and a plurality of signal pads 12c. The upper electrode 12a and the lower electrode 12b are electrodes for electric power, and the signal pads 12c are electrodes for signals. The upper electrode 12a and the signal pads 12c are located on an upper surface of the semiconductor element 12, whereas the lower electrode 12b is located on a lower surface of the semiconductor element 12.

The encapsulant 14 may be constituted of, but not particularly limited to, for example, a thermosetting resin such as an epoxy resin, or other insulators. The encapsulant 14 is also referred to as a mold resin or a package, for example. The semiconductor device 10 is not limited to one including a single semiconductor element 12 but may include a plurality of semiconductor elements. Even in this case, the plurality of semiconductor elements can be encapsulated by the single encapsulant 14. The plurality of semiconductor elements may be connected in series, in parallel, or in a combination of series and parallel within the encapsulant 14.

The semiconductor device 10 further includes an upper insulated substrate 20 and a lower insulated substrate 30. The upper insulated substrate 20 and the lower insulated substrate 30 are opposed to each other with the semiconductor element 12 interposed therebetween. The upper insulated substrate 20 includes an insulator layer 22, an inner conductor layer 24 located on one side of the insulator layer 22, and an outer conductor layer 26 located on the other side of the insulator layer 22. The inner conductor layer 24 and the outer conductor layer 26 are insulated from each other by the insulator layer 22. The inner conductor layer 24 of the upper insulated substrate 20 is joined to the semiconductor element 12 within the encapsulant 14, and is electrically connected to the semiconductor element 12. The inner conductor layer 24 in the present embodiment is divided, by way of example, into a plurality of portions, each of which is soldered to the upper electrode 12a of the semiconductor element 12 or any of the signal pads 12c. Therefore, a solder layer 28 is formed between the inner conductor layer 24 and either the upper electrode 12a or the signal pad 12c. It is noted that a joint structure between the upper insulated substrate 20 and the semiconductor element 12 is not limited to soldering.

The upper insulated substrate 20 is not only electrically connected to the semiconductor element 12, but also thermally connected to the semiconductor element 12. The outer conductor layer 26 of the upper insulated substrate 20 is exposed on the surface of the encapsulant 14, so that heat of the semiconductor element 12 can be dissipated outside of the encapsulant 14. Thus, the upper insulated substrate 20 not only configures a part of a circuit in the semiconductor device 10, but also can function as a heat sink.

The upper insulated substrate 20 in the present embodiment adopts a Direct Bonded Copper (DBC) substrate. The insulator layer 22 is constituted of ceramic, such as aluminum oxide, silicon nitride, aluminum nitride, or the like, and each of the inner conductor layer 24 and the outer conductor layer 26 is constituted of copper. It is noted that the upper insulated substrate 20 is not limited to the DBC substrate, and may be a Direct Bonded Aluminum (DBA) substrate having aluminum joined on both surfaces of the insulator layer 22. A specific configuration of the upper insulated substrate 20 is not particularly limited. The insulator layer 22 may be constituted of, but not limited to ceramic, or alternatively other insulators. The inner conductor layer 24 and the outer conductor layer 26 may also be constituted of, but not limited to copper or aluminum, or alternatively other metal. Furthermore, a joint structure between the insulator layer 22 and each of the conductor layers 24 and 26 is not particularly limited.

The lower insulated substrate 30 includes an insulator layer 32, an inner conductor layer 34 located on one side of the insulator layer 32, and an outer conductor layer 36 located on the other side of the insulator layer 32. The inner conductor layer 34 and the outer conductor layer 36 are insulated from each other by the insulator layer 32. The inner conductor layer 34 of the lower insulated substrate 30 is joined to the semiconductor element 12 and is electrically connected to the semiconductor element 12. The inner conductor layer 34 in the present embodiment is soldered to the lower electrode 12b of the semiconductor element 12 by way of example, and a solder layer 38 is formed between the inner conductor layer 34 and the lower electrode 12b. It is noted that a joint structure between the lower insulated substrate 30 and the semiconductor element 12 is not limited to soldering.

Also, the lower insulated substrate 30 is not only electrically connected to the semiconductor element 12, but also thermally connected to the semiconductor element 12. The outer conductor layer 36 of the lower insulated substrate 30 is exposed on the surface of the encapsulant 14, so that heat of the semiconductor element 12 can be discharged outside of the encapsulant 14. Thus, the lower insulated substrate 30 not only configures a part of a circuit in the semiconductor device 10, but also can function as a heat sink. That is, the semiconductor device 10 in the present embodiment has a double-sided cooling structure in which heat sinks are disposed on both sides of the semiconductor element 12.

The lower insulated substrate 30 in the present embodiment also adopts the Direct Bonded Copper (DBC) substrate. It is noted that like the above-mentioned upper insulated substrate 20, a specific type and configuration of the lower insulated substrate 30 are not particularly limited. The insulator layer 32 of the lower insulated substrate 30 may be constituted of ceramic or other insulating materials. Each of the conductor layers 34 and 36 of the lower insulated substrate 30 may be constituted of copper, aluminum, or other conductors. Also, a joint structure between the insulator layer 32 and each of the conductor layers 34 and 36 is not particularly limited.

The semiconductor device 10 further includes a plurality of external connection terminals 40, 50, and 60. The plurality of external connection terminals 40, 50, and 60 include a first main terminal 40, a second main terminal 50, and a plurality of signal terminals 60 by way of example. Each of the external connection terminals 40, 50, and 60 is constituted of conductor such as copper, aluminum, or the like. Each of the external connection terminals 40, 50, and 60 extends outside from inside of the encapsulant 14 to and is then connected to an external circuit. Within the encapsulant 14, each of the external connection terminals 40, 50, and 60 is electrically connected to the semiconductor element 12 via either the upper insulated substrate 20 or the lower insulated substrate 30. For example, as shown in FIG. 2, the first main terminal 40 is joined to the inner conductor layer 34 of the lower insulated substrate 30 within the encapsulant 14. Thus, the first main terminal 40 is electrically connected to the lower electrode 12b of the semiconductor element 12 via the inner conductor layer 34 of the lower insulated substrate 30. It is noted that the first main terminal 40 is joined to the inner conductor layer 34 by soldering, and a solder layer 48 is formed between the first main terminal 40 and the inner conductor layer 34. However, joining means between the first main terminal 40 and the inner conductor layer 34 is not limited to soldering. The first main terminal 40 and the inner conductor layer 34 may be joined together, for example, using a joining material such as a metal paste, or by welding.

As shown in FIG. 3, the second main terminal 50 is joined to the inner conductor layer 24 of the upper insulated substrate 20 within the encapsulant 14. Thus, the second main terminal 50 is electrically connected to the upper electrode 12a of the semiconductor element 12 via the inner conductor layer 24 of the upper insulated substrate 20. It is noted that the second main terminal 50 is joined to the inner conductor layer 24 by soldering, and a solder layer 58 is formed between the second main terminal 50 and the inner conductor layer 24. It is noted that joining means between the second main terminal 50 and the inner conductor layer 24 is not limited to soldering. The second main terminal 50 and the inner conductor layer 24 may be joined together, for example, using a joining material such as a metal paste, or by welding.

As shown in FIGS. 2 and 3, each of the signal terminals 60 is joined to the inner conductor layer 24 of the upper insulated substrate 20 within the encapsulant 14. Thus, each of the signal terminals 60 is electrically connected to the signal pad 12c corresponding to the semiconductor element 12 via the inner conductor layer 24 of the upper insulated substrate 20. It is noted that the signal terminal 60 is joined to the inner conductor layer 24 by soldering, and a solder layer 68 is formed between the signal terminal 60 and the inner conductor layer 24. However, joining means between the signal terminal 60 and the inner conductor layer 24 is not limited to soldering. The signal terminal 60 and the inner conductor layer 24 may be joined together, for example, using a joining material such as a metal paste, or by welding.

In the above-mentioned semiconductor device 10, when its temperature increases, the inner conductor layers 24 and 34 of the insulated substrates 20 and 30 and each of the external connection terminals 40, 50, and 60 respectively expand thermally. At this time, the thermal expansions of the inner conductor layers 24 and 34 of the insulated substrates 20 and 30 is suppressed by the adjacent insulator layers 22 and 32, respectively, and thereby becomes smaller than the thermal expansions of the external connection terminals 40, 50, and 60. Consequently, a relatively high stress is likely to occur in a joint portion between the inner conductor layers 24 and 34 and the external connection terminals 40, 50, and 60 due to a difference in the thermal expansion therebetween. As a result, durability of the semiconductor device 10 might be reduced.

Figure 4:
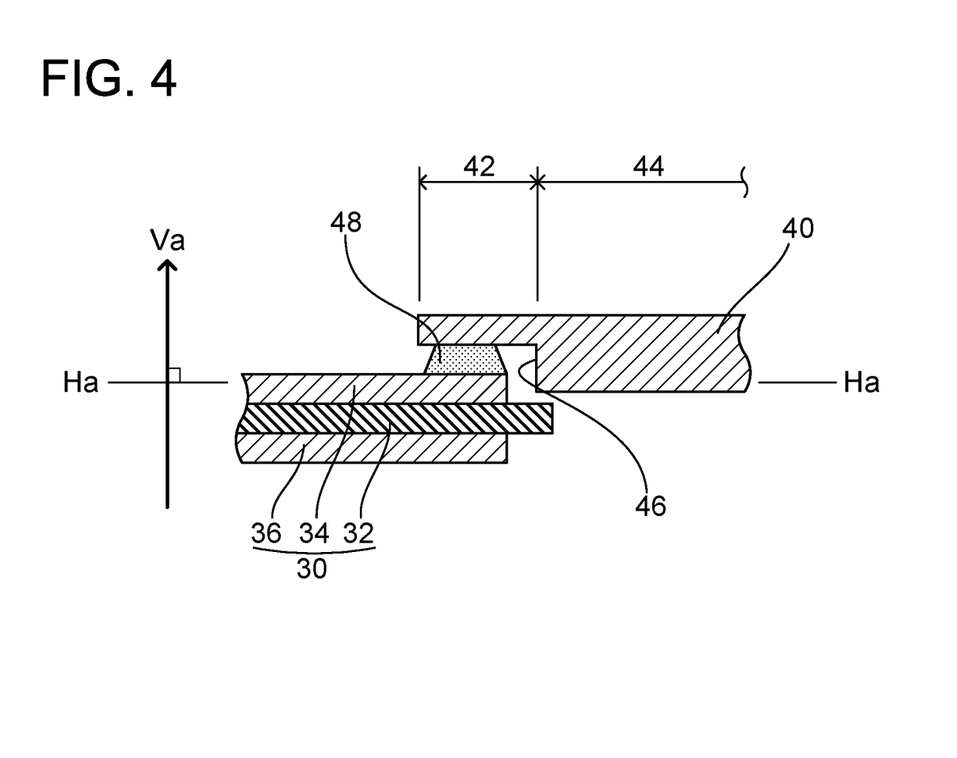
FIG. 4 shows an enlarged view of a joint portion between a first main terminal 40 and an inner conductor layer 34 of a lower insulated substrate 30. Here, an arrow Va in the drawing indicates a direction perpendicular to the lower insulated substrate 30, and a plane Ha indicates a plane parallel to the lower insulated substrate 30.

With regard to the above-mentioned problem, as shown in FIG. 4, the first main terminal 40 includes, along a longitudinal direction thereof, a thin section 42 and a thick section 44 that is thicker than the thin section 42. The first main terminal 40 is joined to the inner conductor layer 34 of the lower insulated substrate 30 at the thin section 42. It is noted that the thin section 42 of the first main terminal 40 is located within the encapsulant 14, and the thick section 44 of the first main terminal 40 extends from the thin section 42 to outside the encapsulant 14 (see FIG. 2). As used herein, the term "thickness of the first main terminal 40" means a size of the first main terminal 40 in the direction Va perpendicular to the lower insulated substrate 30 to which the first main terminal 40 is joined.

As mentioned above, the first main terminal 40 includes the thin section 42 with a small thickness, and is joined to the inner conductor layer 34 of the lower insulated substrate 30 at the thin section 42. In the thin section 42 with the small thickness, thermal stress that would be generated in the first main terminal 40 is suppressed, thereby reducing a stress that occurs in the joint portion between the first main terminal 40 and the inner conductor layer 34. In addition, the first main terminal 40 also includes the thick section 44 with a large thickness, so that in the thick section 44, the first main terminal 40 can maintain a strength required for connection with an external component.

As shown in FIG. 4, in the semiconductor device 10 of the present embodiment, at least a part of the thick section 44 of the first main terminal 40 and at least a part of the inner conductor layer 34 of the lower insulated substrate 30 are located in the common plane Ha which is parallel to the lower insulated substrate 30. With this configuration, the thickness of the thick section 44 can be increased while the entire thickness of the semiconductor device 10 can be reduced. Here, the term "thickness of the semiconductor device 10" means a size of the semiconductor device 10 in a direction Va perpendicular to the lower insulated substrate 30. In the example shown in FIG. 4, a boundary 46 between the thin section 42 and the thick section 44 is located in a range facing the insulator layer 32 of the lower insulated substrate 30 as viewed along the direction Va. Alternatively, the boundary 46 may be located outside the range facing the insulator layer 32 of the lower insulated substrate 30 as viewed along the direction Va.

In the semiconductor device 10 of the present embodiment, the thickness of the thin section 42 in the first main terminal 40 is smaller than a thickness of the inner conductor layer 34 of the lower insulated substrate 30. As mentioned above, the thermal expansion of the inner conductor layer 34 is restricted by the adjacent insulator layer 32. Through this, when the thickness of the thin section 42 of the first main terminal 40 is smaller than the thickness of the inner conductor layer 34, the stress that occurs in the joint portion between the first main terminal 40 and the inner conductor layer 34 can be effectively reduced.

Figure 5:
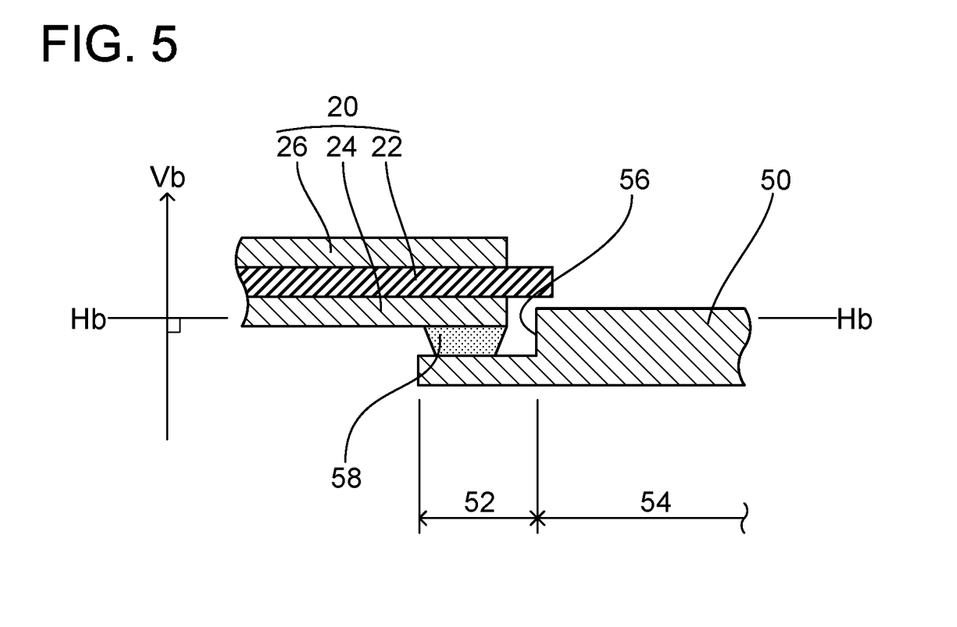
FIG. 5 shows an enlarged view of a joint portion between a second main terminal 50 and an inner conductor layer 24 of an upper insulated substrate 20. Here, an arrow Vb in the drawing indicates a direction perpendicular to the upper insulated substrate 20, and a plane Hb indicates a plane parallel to the upper insulated substrate 20.

As shown in FIG. 5, the second main terminal 50 also includes, along a longitudinal direction thereof, a thin section 52 and a thick section 54 that is thicker than the thin section 52. The second main terminal 50 is joined to the inner conductor layer 24 of the upper insulated substrate 20 at the thin section 52. It should be noted that the thin section 52 of the second main terminal 50 is located within the encapsulant 14, and the thick section 54 of the second main terminal 50 extends from the thin section 52 to outside the encapsulant 14 (see FIG. 3). As used herein, the term "thickness of the second main terminal 50" means the size of the second main terminal 50 in the direction Vb perpendicular to the upper insulated substrate 20 to which the second main terminal 50 is joined. It is noted that in the example shown in FIG. 5, a boundary 56 between the thin section 52 and the thick section 54 is located in a range facing the upper insulated substrate 20. Alternatively, the boundary 56 may be located outside the range facing the upper insulated substrate 20.

As mentioned above, the second main terminal 50 also includes the thin section 52 with a small thickness, and is joined to the inner conductor layer 24 of the upper insulated substrate 20 at the thin section 52. In the thin section 52 with the small thickness, thermal stress that would be generated in the second main terminal 50 is suppressed, thereby reducing stress that occurs in the joint portion between the second main terminal 50 and the inner conductor layer 24. In addition, the second main terminal 50 also includes the thick section 54 with a large thickness, so that in the thick section 54, the second main terminal 50 can maintain a strength required for connection with an external component.

As shown in FIG. 5, in the semiconductor device 10 of the present embodiment, at least a part of the thick section 54 of the second main terminal 50 and at least a part of the inner conductor layer 24 of the upper insulated substrate 20 are located in the common plane Hb which is parallel to the upper insulated substrate 20. With this configuration, the thickness of the thick section 54 can be increased while reducing the entire thickness of the semiconductor device 10.

In the semiconductor device 10 of the present embodiment, a thickness of the thin section 52 of the second main terminal 50 is smaller than a thickness of the inner conductor layer 24 of the upper insulated substrate 20. As mentioned above, the thermal expansion of the inner conductor layer 24 is restricted by the adjacent insulator layer 22. Through this, when the thickness of the thin section 52 of the second main terminal 50 is smaller than the thickness of the inner conductor layer 24, a stress that occurs in the joint portion between the second main terminal 50 and the inner conductor layer 24 can be effectively reduced.

Figure 6:
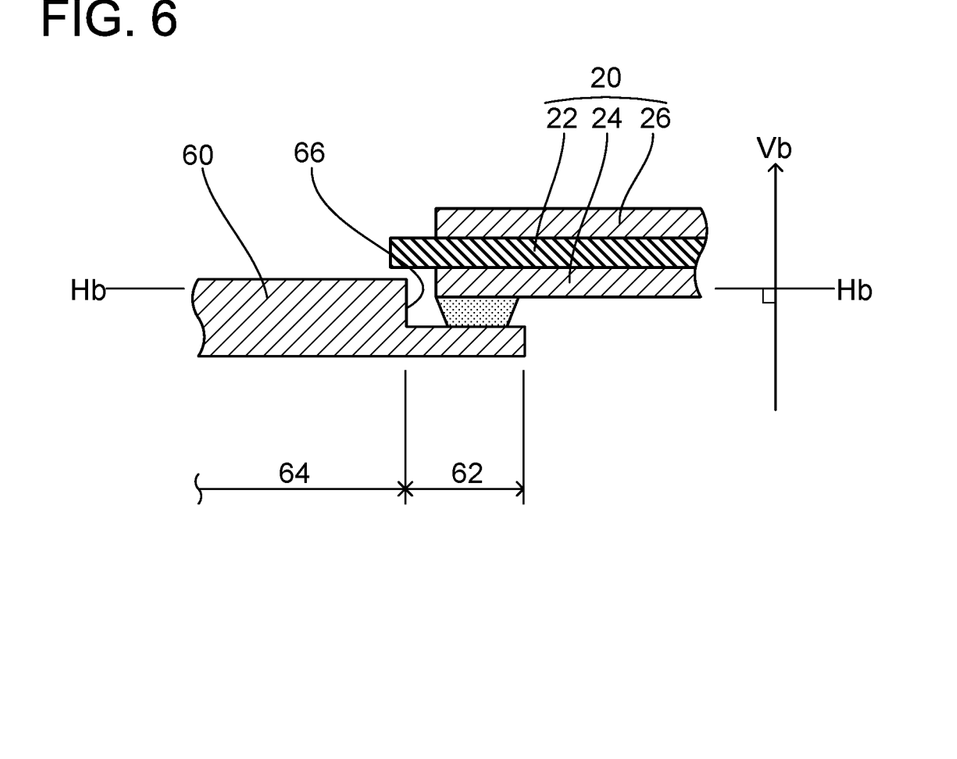
FIG. 6 shows an enlarged view of a joint portion between a signal terminal 60 and the inner conductor layer 24 of the upper insulated substrate 20.

Likewise, as shown in FIG. 6, each of the signal terminals 60 includes, along a longitudinal direction thereof, a thin section 62 and a thick section 64 which is thicker than the thin section 62. The signal terminal 60 is joined to the inner conductor layer 24 of the upper insulated substrate 20 at the thin section 62. It should be noted that the thin section 62 of the signal terminal 60 is located within the encapsulant 14, and the thick section 64 of the signal terminal 60 extends from the thin section 62 to outside the encapsulant 14 (see FIGS. 2 and 3). As used herein, the term "thickness of the signal terminal 60" means the size of the signal terminal 60 in the direction Vb perpendicular to the upper insulated substrate 20 to which the signal terminal 60 is joined. In the example shown in FIG. 6, a boundary 66 between the thin section 62 and the thick section 64 is located in a range facing the insulator layer 22 of the upper insulated substrate 20 as viewed along the direction Vb. Alternatively, the boundary 66 may be located outside the range that is opposed to the insulator layer 22 of the upper insulated substrate 20 as viewed along the direction Vb.

As mentioned above, also, the signal terminal 60 includes the thin section 62 with a small thickness, and is joined to the inner conductor layer 24 of the upper insulated substrate 20 at the thin section 62. In the thin section 62 with the small thickness, thermal stress that would be generated in the signal terminal 60 is suppressed, thereby reducing a stress that occurs in the joint portion between the signal terminal 60 and the inner conductor layer 24. In addition, each signal terminal 60 also includes the thick section 64 with a large thickness, so that in the thick section 64, the signal terminal 60 can maintain the strength required for connection with an external component.

As shown in FIG. 6, in the semiconductor device 10 of the present embodiment, at least a part of the thick section 64 of the signal terminal 60 and at least a part of the inner conductor layer 24 of the upper insulated substrate 20 are located in the common plane Hb which is parallel to the upper insulated substrate 20. With this configuration, the thickness of the thick section 64 can be increased while the entire thickness of the semiconductor device 10 can be reduced.

In the semiconductor device 10 of the present embodiment, the thickness of the thin section 62 of the signal terminal 60 is smaller than the thickness of the inner conductor layer 24 of the upper insulated substrate 20. As mentioned above, the thermal expansion of the inner conductor layer 24 is restricted by the adjacent insulator layer 22. Through this, when the thickness of the thin section 62 of the signal terminal 60 is smaller than the thickness of the inner conductor layer 24, the stress that occurs in the joint portion between the signal terminal 60 and the inner conductor layer 24 can be effectively reduced.

Figure 7:
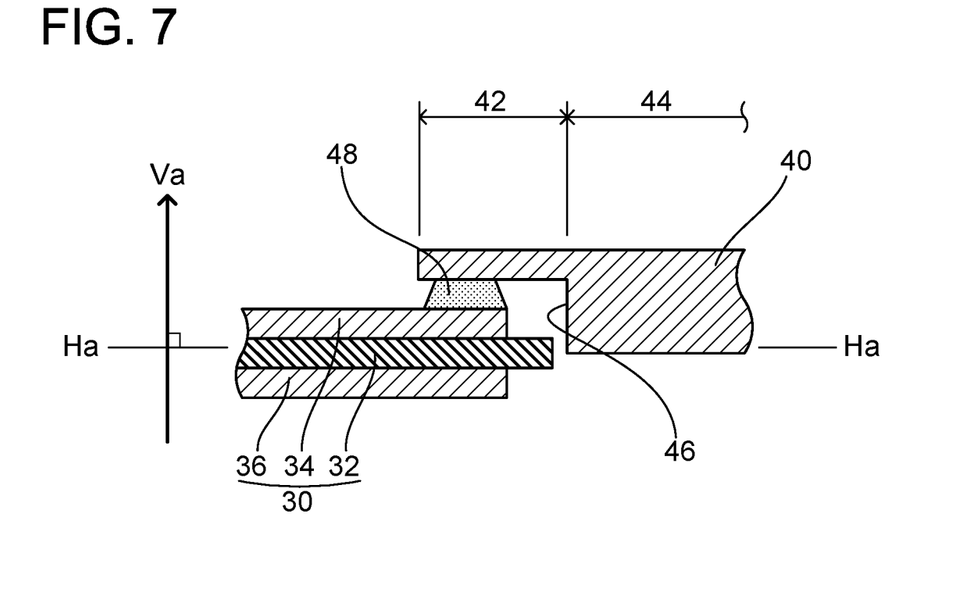
FIG. 7 shows a variant of the first main terminal 40. In this variant, a part of the thick section 44 of the first main terminal 40 and at least a part of the insulator layer 32 of the lower insulated substrate 30 are located in the common plane Ha that is parallel to the lower insulated substrate 30.

Structures of the external connection terminals 40, 50, and 60 can be variously modified. For example, in the first main terminal 40 shown in FIG. 4, the boundary 46 between the thin section 42 and the thick section 44 is located within a range facing the insulator layer 32 of the lower insulated substrate 30 as viewed along the direction Va. In contrast, as shown in FIG. 7, in a variant of the first main terminal 40, the boundary 46 between the thin section 42 and the thick section 44 may be located outside the range facing the insulator layer 32 of the lower insulated substrate 30 as viewed along the direction Va. In this case, a part of the thick section 44 of the first main terminal 40 and at least a part of the insulator layer 32 of the lower insulated substrate 30 may be located in the common plane Ha which is parallel to the lower insulated substrate 30. With this configuration, the thickness of the semiconductor device 10 can be further reduced. Alternatively, the thick section 44 of the first main terminal 40 can be made thicker. The configuration of this variant is not limited to be applied to the first main terminal 40, and can also be applied to other external connection terminals, such as the second main terminal 50 and the signal terminals 60, in a same manner.

Figure 8:
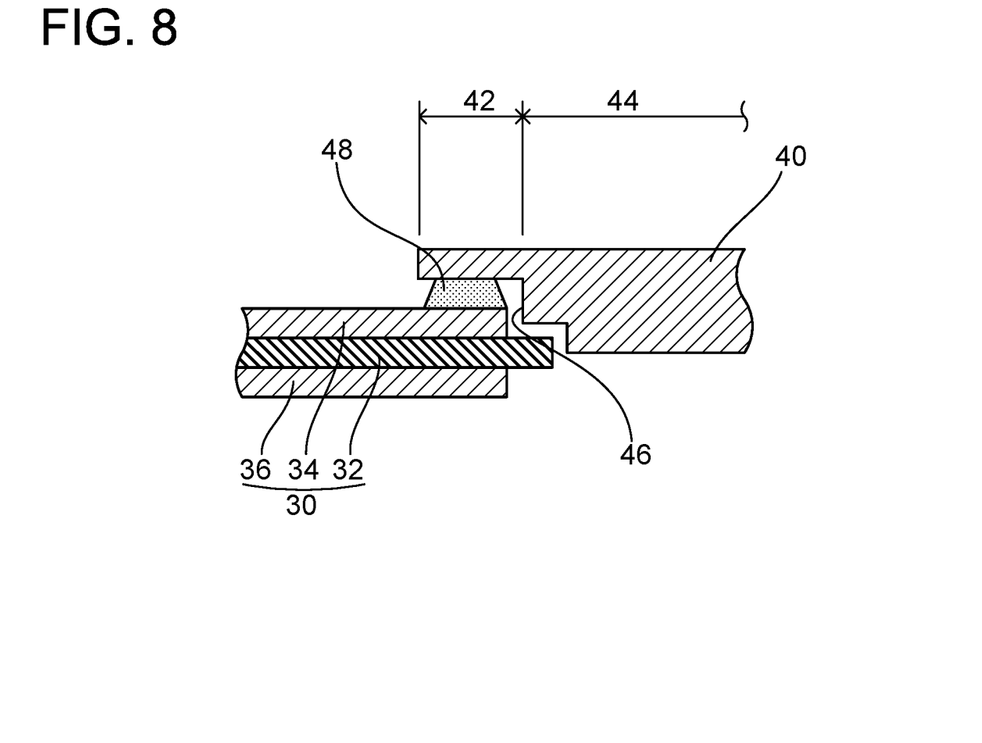
FIG. 8 shows another variant of the first main terminal 40. In this variant, the thickness of the thick section 44 of the first main terminal 40 changes along a longitudinal direction of the first main terminal 40.

Alternatively, as shown in FIG. 8, in another variant of the first main terminal 40, the thickness of the thick section 44 may be changed along the longitudinal direction thereof in a stepwise manner (or continuously). In this case, by way of example, the thickness of the thick section 44 may be changed along a profile of the adjacent lower insulated substrate 30. With this configuration, for example, the strength of the first main terminal 40 can be enhanced. The configuration of this variant is not limited to be applied to the first main terminal 40, and can also be applied to other external connection terminals, such as the second main terminal 50 and the signal terminals 60, in a same manner.

Figure 9:
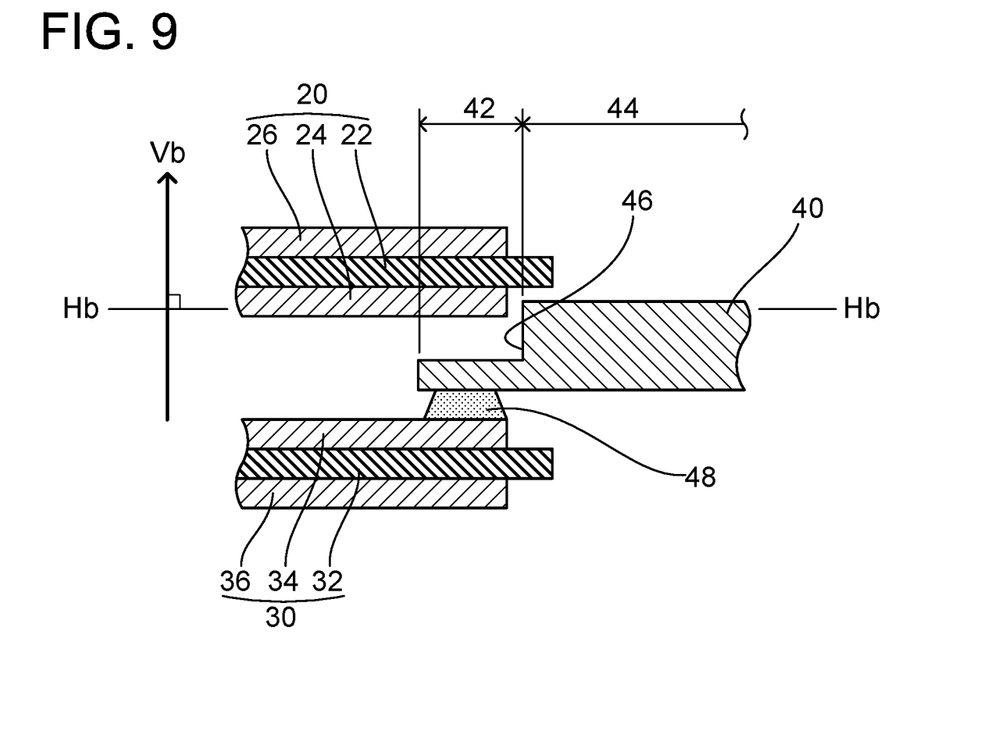
FIG. 9 shows another variant of the first main terminal 40. In this variant, the thick section 44 protrudes toward the upper insulated substrate 20 with respect to the thin section 42.

Alternatively, as shown in FIG. 9, in another variant of the first main terminal 40, a direction in which the thick section 44 protrudes with respect to the thin section 42 may not be a direction toward the lower insulated substrate 30 to which the first main terminal 40 is joined, but a direction toward the upper insulated substrate 20 opposed to the lower insulated substrate 30. In this case, at least a part of the thick section 44 of the first main terminal 40 and at least a part of the inner conductor layer 24 of the upper insulated substrate 20 may be located in the common plane Hb which is parallel to the upper insulated substrate 20. With this configuration, the thickness of the thick section 44 can be increased while the entire thickness of the semiconductor device 10 can be reduced. The configuration of this variant is not limited to be applied to the first main terminal 40, and can also be applied to other external connection terminals, such as the second main terminal 50 and the signal terminals 60, in a same manner.

In a variant shown in FIG. 9, the boundary 46 between the thin section 42 and the thick section 44 is located within a range facing the insulator layer 22 of the upper insulated substrate 20 as viewed along the direction Vb. In contrast, in another modified example, the boundary 46 between the thin section 42 and the thick section 44 may be located outside the range that is opposed to the insulator layer 22 of the upper insulated substrate 20 as viewed along the direction Vb. In this case, a part of the thick section 44 of the first main terminal 40 and at least a part of the insulator layer 22 of the upper insulated substrate 20 may be located in the common plane Hb which is parallel to the upper insulated substrate 20. With this configuration, the thickness of the semiconductor device 10 can be further reduced.

The semiconductor device 10 described herein includes two insulated substrates 20 and 30 opposed to each other. However, in other embodiments, the semiconductor device 10 may include a single insulated substrate or three or more insulated substrates. In a further embodiment, the semiconductor device 10 may include a single external connection terminal, instead of the plurality of external connection terminals 40, 50, and 60. Alternatively, even when the semiconductor device 10 includes the plurality of external connection terminals 40, 50, and 60, it suffices that at least one of the plurality of external connection terminals 40, 50, and 60 includes the thin section 42 and the thick section 44.

What is claimed is:

1. A semiconductor device comprising:
a semiconductor element;
an insulated substrate on which the semiconductor element is located; and
an external connection terminal electrically connected to the semiconductor element via the insulated substrate;
wherein the insulated substrate comprises an insulator layer, an inner conductor layer located on one side of the insulator layer and electrically connected to the semiconductor element, and an outer conductor layer located on the other side of the insulator layer
the external connection terminal comprises, along a longitudinal direction of the external connection terminal, a thin section and a thick section that is thicker than the thin section, and the external connection terminal is joined to the inner conductor layer of the insulated substrate at the thin section.

2. The semiconductor device according to claim 1, wherein at least a part of the thick section of the external connection terminal and at least a part of the inner conductor layer of the insulated substrate are located in a common plane that is parallel to the insulated substrate.

3. The semiconductor device according to claim 2, wherein a part of the thick section of the external connection terminal and at least a part of the insulator layer of the insulated substrate are located in a common plane that is parallel to the insulator substrate.

4. The semiconductor device according to claim 1, wherein a thickness of the thin section of the external connection terminal is smaller than a thickness of the inner conductor layer of the insulated substrate.

5. The semiconductor device according to claim 1, further comprising an encapsulant encapsulating the semiconductor element,
wherein the thin section of the external connection terminal is located within the encapsulant and the thick section of the external connection terminal extends from the thin section to outside the encapsulant.

6. The semiconductor device according to claim 5, wherein the outer conductor layer of the insulated substrate is exposed on a surface of the encapsulant.

7. The semiconductor device according to claim 6, further comprising a second insulated substrate opposed to the insulated substrate with the semiconductor device interposed,
wherein the second insulated substrate comprises a second insulator layer, a second inner conductor layer located on one side of the second insulator layer and electrically connected to the semiconductor element, and a second outer conductor layer located on the other side of the second insulator layer, and
the second outer conductor layer of the second insulated substrate is exposed on a surface of the encapsulant.

8. The semiconductor device according to claim 7, further comprising a second external connection terminal electrically connected to the semiconductor element via the second insulated substrate,
wherein the second external connection terminal comprises, along a longitudinal direction of the second external connection terminal, a thin section and a thick section that is thicker than the thin section, and the second external connection terminal is joined to the second inner conductor layer of the second insulated substrate at the thin section.

9. The semiconductor device according to claim 8, wherein at least a part of the thick section of the second external connection terminal and at least a part of the second inner conductor layer of the second insulated substrate are located in a common plane that is parallel to the second insulated substrate.

10. The semiconductor device according to claim 9, wherein a part of the thick section of the second external connection terminal and at least a part of the second insulator layer of the second insulated substrate are located in a common plane that is parallel to the second insulated substrate.

11. The semiconductor device according to claim 8, wherein a thickness of the thin section of the second external connection terminal is smaller than a thickness of the second inner conductor layer of the second insulated substrate.

12. The semiconductor device according to claim 8, wherein the thin section of the second external connection terminal is located within the encapsulant and the thick section of the second external connection terminal extends from the thin section to outside the encapsulant.

* * * * *

UNITED STATES PATENT AND TRADEMARK OFFICE
CERTIFICATE OF CORRECTION

PATENT NO. : 10,566,295 B2  
APPLICATION NO. : 16/201307  
DATED : February 18, 2020  
INVENTOR(S) : Akinori Sakakibara

Page 1 of 1

It is certified that error appears in the above-identified patent and that said Letters Patent is hereby corrected as shown below:

On the Title Page

Item (72), inventor, city, delete "Toyota" and insert --Toyota-shi Aichi-ken--, therefor.

Signed and Sealed this  
Fifth Day of May, 2020

Andrei Iancu  
*Director of the United States Patent and Trademark Office*